(12) United States Patent
Ikakura et al.

(10) Patent No.: US 6,255,230 B1
(45) Date of Patent: Jul. 3, 2001

(54) METHOD FOR MODIFYING A FILM FORMING SURFACE OF A SUBSTRATE ON WHICH A FILM IS TO BE FORMED, AND METHOD FOR MANUFACTURING A SEMICONDUCTOR DEVICE USING THE SAME

(75) Inventors: Hiroshi Ikakura; Syunji Nishikawa; Noboru Tokumasu; Takayoshi Azumi, all of Tokyo (JP)

(73) Assignees: Canon Sales Co., Inc.; Semiconductor Process Laboratory Co., Ltd., both of (JP)

( * ) Notice: Subject to any disclaimer, the term of this patent is extended or adjusted under 35 U.S.C. 154(b) by 0 days.

(21) Appl. No.: 09/444,991

(22) Filed: Nov. 23, 1999

(30) Foreign Application Priority Data

Jun. 4, 1999 (JP) .................................................. 11-158712

(51) Int. Cl.$^7$ .......................... H01L 21/31; H01L 21/469
(52) U.S. Cl. ......................... 438/765; 438/770; 438/790; 438/794
(58) Field of Search ..................................... 438/790, 770, 438/794, 974, 765

(56) References Cited

U.S. PATENT DOCUMENTS

| 5,424,253 | * | 6/1995 | Usami et al. | 437/238 |
|---|---|---|---|---|
| 5,470,800 | | 11/1995 | Muroyama et al. | 427/539 |
| 5,605,867 | * | 2/1997 | Sato et al. | 437/235 |
| 5,656,337 | * | 8/1997 | Park et al. | 427/539 |

FOREIGN PATENT DOCUMENTS

| 5-259297 | 10/1993 | (JP) . |
|---|---|---|
| 6-181205 | 6/1994 | (JP) . |
| 6-267939 | 9/1994 | (JP) . |
| 7-29901 | 1/1995 | (JP) . |
| 7-50295 | 2/1995 | (JP) . |
| 7-99191 | 4/1995 | (JP) . |
| 7-122552 | 5/1995 | (JP) . |
| 9-129632 | 5/1997 | (JP) . |
| 9-148324 | 6/1997 | (JP) . |
| 11-74485 | 3/1999 | (JP) . |
| 11-288933 | 10/1999 | (JP) . |

OTHER PUBLICATIONS

Silicon Processing for the VLSI Era–vol. 2, S.Wolf, pp. 196–199 no month, 1990.*

Patent Abstracts of Japan vol. 018, No. 171 (E–1529), Mar. 23, 1994.

Patent Abstracts of Japan vol. 1997, No. 12, Dec. 25, 1997.

* cited by examiner

*Primary Examiner*—John F. Niebling
*Assistant Examiner*—Alexander G. Ghyka
(74) *Attorney, Agent, or Firm*—Lorusso & Loud

(57) ABSTRACT

Disclosed is a method for modifying a film-forming surface of a substrate, which is capable removing a base surface dependency in forming a film on the film-forming surface of the substrate prior to formation of a film by a thermal CVD method using a reactant gas containing an ozone-containing gas containing ozone ($O_3$) in oxygen ($O_2$) and Tetra-Ethyl-Ortho-Silicate. The method comprises the step of modifying the film-forming surface 12a of the substrate 102 by allowing any one of ammonia, hydrazine, an amine, gases thereof and aqueous solutions thereof to contact with the surface of the substrate before forming an insulating film 13 on the surface 12a of the substrate 102.

13 Claims, 11 Drawing Sheets

Surface Modification Treatment by Modification Substances Containing Active Nitrogen or In Aqueous Solution After Drying < Horizontal Type >

< Vertical Type >

METHOD FOR MODIFYING A FILM FORMING SURFACE OF A SUBSTRATE ON WHICH A FILM IS TO BE FORMED, AND METHOD FOR MANUFACTURING A SEMICONDUCTOR DEVICE USING THE SAME

BACKGROUND OF THE INVENTION

1. Field of the Invention

The present invention relates to a method for modifying a film-forming surface of a substrate (hereinafter referred to as a base), which is capable of improving a base surface dependency to a film formation on the base, prior to the formation of the film by a thermal CVD (Chemical Vapor Deposition) method using a reactant gas (hereinafter referred to as "$O_3$/TEOS reactant gas") containing an ozone-containing gas containing ozone ($O_3$) in oxygen (O) and tetra-ethyl-ortho-silicate (TEOS), and a manufacturing method for a semiconductor device using the same.

Here, the base surface dependency means that when an insulating film is formed on the surface of the base particularly by use of $O_3$/TEOS reactant gas, film formation rates differ depending on a difference of substances constituting the surface of the base exposed or the shapes of an acute angle portion and obtuse angle portion in concave and convex portions, or the surface of the insulating film is not flat due to an occurrence of fine unevenness on the formed insulating film, as shown in FIG. 1.

2. Description of the Prior Art

With recent progress in very high integration and multi-layered wiring of semiconductor devices, a demand has been made for development of a technique for forming an insulating film, which is excellent in flatness, embedment of a concavity (hereinafter referred to as concavity embedment) and step coverage, and which controls penetration of moisture and impurities. As a technology for forming the insulating film that meets the above demand, a CVD method using an $O_3$/TEOS reactant gas has been attracting attention.

In the case where a film is formed by the CVD method using the $O_3$/TEOS reactant gas, as the concentration of $O_3$ is increased, a film with a higher quality can be obtained.

On the other hand, the state of the film thus formed strongly depends on the state of the surface of the base. The effect of the base surface dependency on the state of the surface of the base is not observed under a film formation condition where the concentration of $O_3$ is low, however, the effect thereof clearly appears under a film formation condition where the concentration of $O_3$ is high.

It should be noted that the $O_3$/TEOS reactant gas with a high concentration of $O_3$ and a silicon dioxide ($SiO_2$) film formed by the CVD method using this reactant gas are hereinafter referred to as a High $O_3$/TEOS reactant gas and a High $O_3$/TEOS CVD $SiO_2$ film, respectively. Furthermore, the $O_3$/TEOS reactant gas with a low concentration of $O_3$ and the silicon dioxide film formed by the CVD method using this reactant gas are hereinafter referred to as a Low $O_3$/TEOS reactant gas and a Low $O_3$/TEOS CVD $SiO_2$ film, respectively. Still furthermore, the silicon dioxide film formed by the CVD method using the $O_3$/TEOS reactant gas of any concentration of $O_3$ is hereinafter simply referred to as an $O_3$/TEOS CVD $SiO_2$ film.

FIG. 1 is a cross-sectional view showing abnormal growth of a film due to the effects of the base surface dependency.

As is shown in FIG. 1, a base surface dependency on the surface of the substrate 101 on which a film is to be formed (hereinafter referred to as a film-forming substrate) influences the surface of a High $O_3$/TEOS CVD $SiO_2$ film 4, causing the surface of the film 4 to be uneven. At the same time, voids occur in the High $O_3$/TEOS CVD $SiO_2$ film 4. It should be noted that the film-forming substrate 101 is composed of a semiconductor substrate 1, a base insulating film 2 formed thereon and wirings 3a and 3b formed on the base insulating film 2.

The methods shown in FIGS. 2A to 2D have heretofore been employed in order to remove the base surface dependency. The same elements as those shown in FIG. 1 are denoted by the same reference numerals.

The methods are:

(i) irradiating the film-forming surface of the substrate 101 with plasma (FIG. 2A);

(ii) covering the film-forming surface of the substrate 101 with a plasma CVD $SiO_2$ film 5 (FIG. 2B);

(iii) forming a Low $O_3$/TEOS CVD $SiO_2$ film 6 as the base before the High $O_3$/TEOS CVD $SiO_2$ film (FIG. 2C); and (iv) forming the Low $O_3$/TEOS CVD $SiO_2$ film 6 having thin thickness, irradiating the surface thereof with plasma, followed by forming the High $O_3$/TEOS CVD $SiO_2$ film (FIG. 2D). It should be noted that the above methods (iii) and (iv) use a double-layer composed of the Low $O_3$/TEOS CVD $SiO_2$ film 6 and the High $O_3$/TEOS CVD $SiO_2$ film.

However, each of the conventional methods for modifying the film-forming surface of the substrate as given in above (i) to (iv) has the following problems, respectively.

(i) In the method using plasma irradiation, the conditions under which the effects of controlling the base surface dependency appears are not uniform. Accordingly, unification or standardization of the modification conditions by plasma irradiation cannot be achieved in all kinds of the film-forming surfaces of the substrates, but optimization is required as occasion demands. Furthermore, this method additionally requires a plasma enhances CVD apparatus for the plasma irradiation.

(ii) In the modifying method by covering the film-forming surface of the substrate with the plasma CVD $SiO_2$ film 5, the plasma CVD $SiO_2$ film 5 which is very compatible with the High $O_3$/TEOS CVD $SiO_2$ film may be obtained depending on the conditions for film formation by the plasma enhanced CVD method. Accordingly, using the plasma CVD $SiO_2$ film to cover the film-forming surface of the substrate, the High $O_3$/TEOS CVD $SiO_2$ film of excellent quality can be obtained. However, the plasma CVD $SiO_2$ film 5 is intrinsically poor in step coverage, and therefore the plasma CVD $SiO_2$ film 5 is not suitable for a micronized pattern. Furthermore, the plasma enhanced CVD apparatus is additionally required for plasma irradiation.

(iii) In the method of covering the film-forming surface of the substrate with the Low $O_3$/TEOS CVD $SiO_2$ film 6, the Low $O_3$/TEOS CVD $SiO_2$ film 6 is very compatible with the High $O_3$ /TEOS CVD $SiO_2$ film, and the base surface dependency can be removed by covering the film-forming surface of the substrate with the Low $O_3$/ TEOS CVD $SiO_2$ film 6. However, the Low $O_3$ TEOS CVD $SiO_2$ film 6 has isotropic properties and a thickness of at least 100 nm is necessary as the base in this case. Therefore, the Low $O_3$/TEOS CVD $SiO_2$ film 6 is not suitable for the micronized pattern.

On the other hand, another method for removing the dependency on the film-forming surface of the substrate has also been attempted. This method uses the $O_3$/TEOS CVD SiO2 film, instead of the Low $O_3$/TEOS CVD $SiO_2$ film 6, as the base under low pressure. However, using the $O_3$/TEOS CVD $SiO_2$ film under low pressure is substantially the same as using the Low $O_3$/TEOS CVD $SiO_2$ film 6. Accordingly, using the $O_3$/TEOS CVD $SiO_2$ film under low pressure is not suitable for the micronized pattern for the same reason that applies to the Low $O_3$/TEOS CVD $SiO_2$ film 6.

Furthermore, the $O_3$/TEOS CVD $SiO_2$ film under a Low $O_3$ atmosphere and low pressure is inferior to the High $O_3$/TEOS CVD $SiO_2$ film in quality.

(iv) The method of covering by the Low $O_3$/TEOS CVD $SiO_2$ film 6 and irradiating the surface of the film with plasma is not suitable for the micronized pattern and makes manufacturing steps of the semiconductor device complicated.

Thus, all in all, the conventional methods for modifying a surface of a base are not so suitable for covering a narrow and deep concavity. Accordingly, the high integration of the semiconductor devices have been desired nowadays, and formations of an interlayer insulating film and a cover insulating film with a high quality by using a film forming method by the CVD method have been desired. In particular, covering the narrow and deep concavity has been desired.

SUMMARY OF THE INVENTION

An object of the present invention is to provide a method for modifying a film-forming surface of a substrate, which is capable of almost completely removing a base surface dependency to a film formation on the film-forming substrate by using very simple technologies, and a method of manufacturing a semiconductor device using the same.

In the method of the present invention of modifying the film-forming surface of the substrate, the film-forming surface of the substrate is allowed to contact with ammonia, hydrazine, an amine or an amino compound, gaseous derivatives thereof or aqueous solutions thereof, thus modifying the film-forming surface of the substrate.

To be more specific, the foregoing substances used for modifying the film-forming surface of the substrate (hereinafter referred to as "modification substances") have characteristics of having an active nitrogen and a hydrophilic nature, and thus it can be considered that the modification substances have a function to dehydrate the film-forming surface of the substrate by reacting with a hydroxyl radical or $H_2O$ bound to silicon in the film-forming surface of the substrate. With this function, a dangling bond of silicon forming the film-forming surface of the substrate can be terminated in $NH_4O$— or $NH_2$-base. The base surface dependency on the film-forming surface of the substrate for the film to be formed on the film-forming substrate can be deleted. In particular, since a neutral gas is used as the modification substance, the modification substance covers a narrow and deep concavity, so that the base surface dependency of the surface of the concavity can be deleted.

Accordingly, when a film is formed on the film-forming surface of the substrate, from which the base surface dependency was deleted, by a thermal CVD method, it is possible to obtain an insulating film or a cover film with an excellent quality, which is free from roughness of its surface or a void without lowering a film formation rate. Additionally, almost complete embedment of the narrow and deep concavity can be achieved.

BRIEF DESCRIPTION OF THE DRAWING

For a more complete understanding of the present invention and the advantages thereof, reference in now made to the following description taken in conjunction with the accompanying drawings, in which:

FIG. 10A shows a horizontal system and FIG. 10B shows a vertical system, respectively.

DETAILED DESCRIPTION OF THE PREFERRED EMBODIMENT

Figure 1:
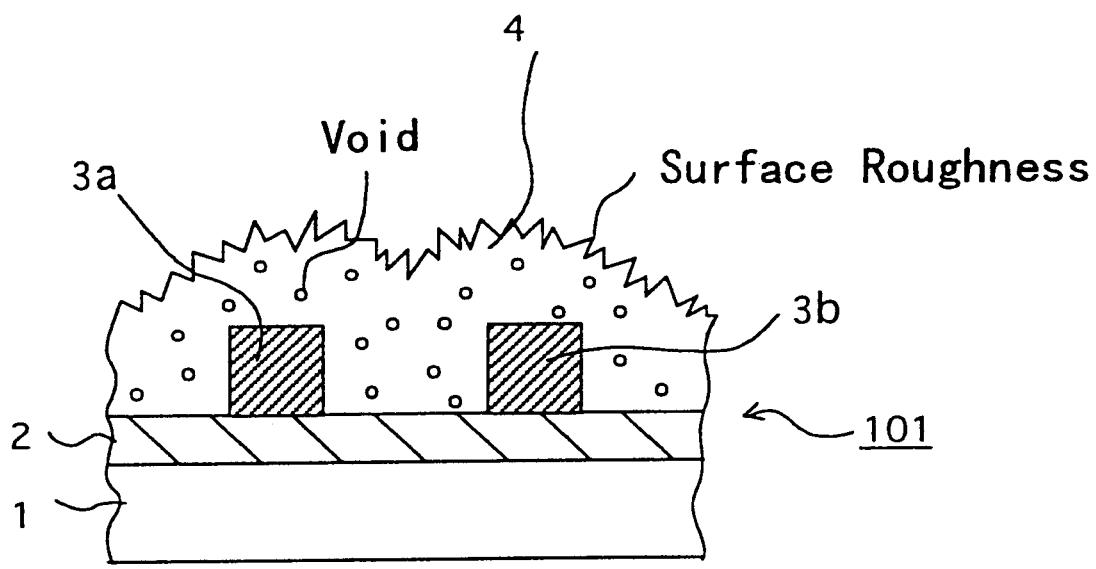
FIG. 1 is a cross-sectional view showing a situation of a conventional semiconductor device in which High $O_3$/TEOS CVD $SiO_2$ film is formed before a modification treatment for a film-forming surface of a substrate.

Embodiments of the present invention will be described with reference to the accompanying drawings.
(The process until the present invention was made)

First, the process until the present invention was made and the principle of the present invention will be described.

When an insulating film is formed by a CVD method on a surface of an $SiO_2$ film, $Si_3N_4$ film or the like composing a film-forming substrate, a state of the insulating film strongly depends on a state of the surface of an $SiO_2$ film, $Si_3N_4$ film or the like. That is, the insulating film to be formed shows abnormal growth. For example, with reference to the $SiO_2$ film, $Si_3N_4$ film and the like, which are formed by various manufacturing method, when an insulating film is formed by a CVD method on an insulating film as the base film formed by any of a plasma CVD method, a thermal oxide method, and a reduced pressure thermal CVD method, which is not compatible with an $O_3$TEOS reactant gas, the state of the surface of the base film strongly effects the insulating film formed thereon, so as to cause a porous and rough surface of the insulating film and reduction of a film formation rate for the insulating film.

In air, which means, in a clean room having humidity, the surfaces of these $SiO_2$ films sometimes exhibit hydration state, which is caused by adsorption of $H_2O$ or an OH radical, by being left in the clean room. However, it is assumed that the hydration is a factor, in formation of a High $O_3$/TEOS NSG film (an NSG film means an $SiO_2$ film which does not contain impurities such as phosphorus, boron and the like), which prevents the smooth and uniform adsorption of an intermediate reactive product and uniform film formation, concavity embedment and fluidity.

Accordingly, it can be considered that $H_2O$ and OH radical adsorbed to the surface of the base film should be removed therefrom prior to a film formation so as to make the surface of the base film hydrophobic and then the film formation should be performed before the hydrophobic nature of the surface of the base film is not lost.

It has been known that, in a plasma irradiation treatment among the conventional modification treatments for the film-forming surface of the substrate, the hydrophobic nature of the surface of the $SiO_2$ film can be maintained for about one week even if the film is left in the clean room under a condition that the film is exposed to the air. In this case, it is estimated that, moisture and the like in the surface of the base film are removed therefrom by the plasma irradiation and the heat, and that a state where a dangling bond of Si in the surface of the $SiO_2$ film is terminated in an atom of oxygen is created, as is represented by a Chemical Formula 1 below.

[Chemical Formula 1]

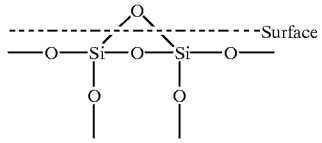

On the other hand, it is considered that the dangling bond of Si in the surface of the base film is terminated in —N, —$NH_2$, —H or the like depending on an atmosphere used in the plasma treatment. This is the reason why heat plays an important role in the plasma irradiation treatment. However, it cannot be considered that the entire surface of a narrow and deep concavity can be treated by plasma in the above describe manner without exception.

Figure 4A:
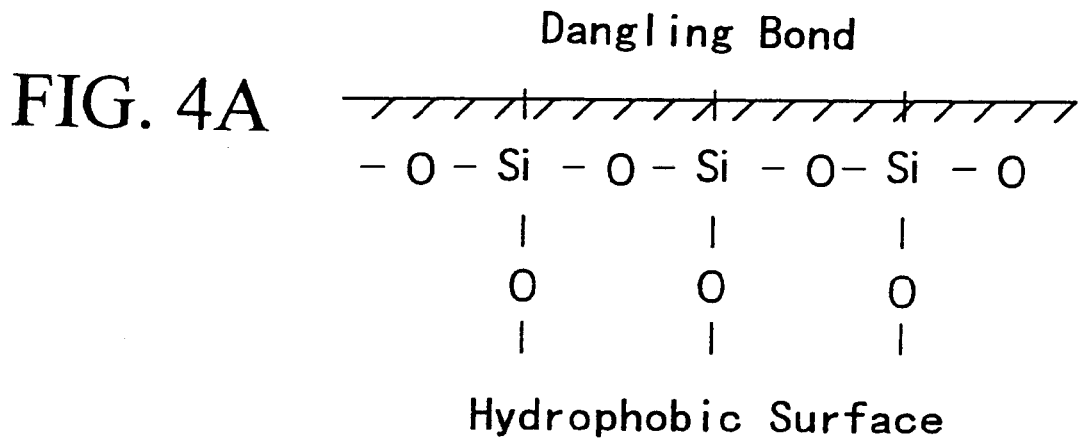
FIGS 4A to 4E are drawings showing the principle of the method for modifying the film-forming surface of the substrate according to the embodiments of the present invention.
Figure 4B:
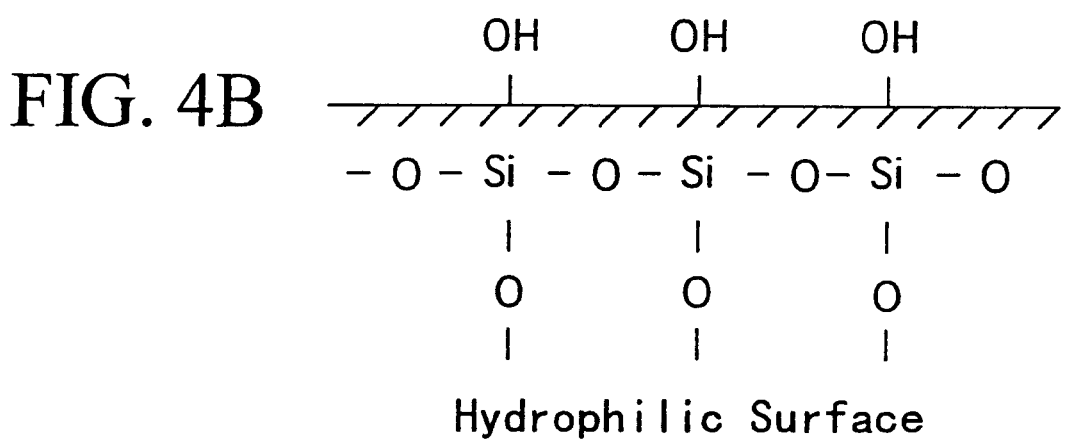
Figure 4B:
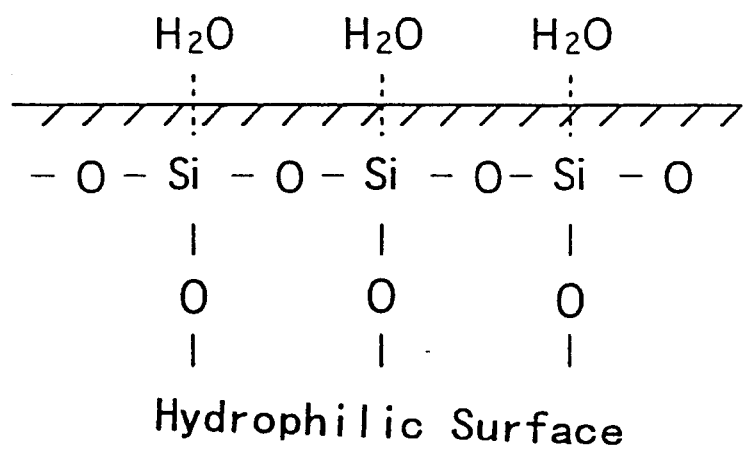

FIGS. 4A and 4B shows the schematic state of the surface of the $SiO_2$ film. FIG. 4A shows the state of the film-forming substrate immediately after formation of the $SiO_2$ film. The upper and lower drawings of FIG. 4B show the state of the film-forming surface of the substrate after the surface was left in the air. These two drawings show the state where the dangling bond of Si is bonded with a hydroxyl radical (OH), and the state where the dangling bond of Si is bonded with an molecule of water ($H_2O$), respectively.

An invention has been already made by the inventor of the present invention, in which using a halide of silicon, for example, $SiCl_4$ (silicon tetrachloride) which exhibits the highest reactivity, is applied to the surface of the $SiO_2$ film. As is represented by a Chemical Formula 2 below, by exposing the film-forming surface of the substrate to $SiCl_4$, HCl is generated thus producing silanol.

[Chemical Formula 2]

The reaction between the $SiO_2$ film and $SiCl_4$ shows very strong dehydration. At this time, if a temperature of a reaction portion is 100° C. or higher during the reaction period, silanol gradually decomposes into $SiO_2$ as shown in a Chemical Formula 3, and $H_2O$ is removed from the reaction portion of the surface of the $SiO_2$ film.

[Chemical Formula 3]

Furthermore, the following can be assumed. Cl of $SiCl_4$ reacts with —OH and generates HCl, and creates simultaneously an Si—Cl bond by substituting for O, so that Si in the surface of $SiO_2$ is terminated in Cl.

In the film-forming surface of the substrate thus treated, if a temperature of the film-forming substrate is 100° C. or higher, water and HCl are released from the system. Thus an Si—O bond or Si—Cl bond is left in the film-forming surface of the substrate as shown in a Chemical Formula 4 below.

[Chemical Formula 4]

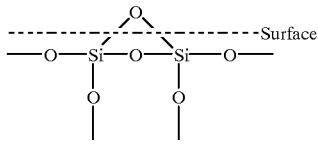

That is, the film-forming surface of the substrate will be chlorinated. With chlorination, the film-formation surface of the substrate shows a hydrophobic nature. As a result, it was found that the base surface dependency is deleted for film formation by CVD method using the High $O_3$/TEOS reactant gas.

In the present invention, excellent wettability can be provided to the film-forming surface of the substrate by using the modification substance which has active nitrogen and a hydrophilic nature, instead of using a halide of silicon typified by $SiX_4$ or compound thereof, and by allowing the modification substance to adsorb to the film-forming surface of the substrate.

Furthermore, the modification substance of the present invention has a function of dehydrating the film-forming surface of the substrate by reacting with $H_2O$ or the OH radical attached to the film-forming surface of the substrate. In the case where a wafer is immersed in, for example, ammonia water having the concentration of 30% for an hour, the modification substance of the present invention in ammonia water reacts with the OH radical on the surface of the $SiO_2$ film to form $H_2O$ and removes $H_2O$ by its dehydrating function. With the reaction and the function described above, the state represented by the Chemical Formula 5 below is created and the dangling bond of Si in the surface of the $SiO_2$ film is terminated in $NH_4O$—.

[Chemical Formula 5]

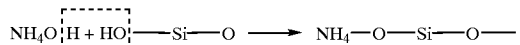

Figure 4C:
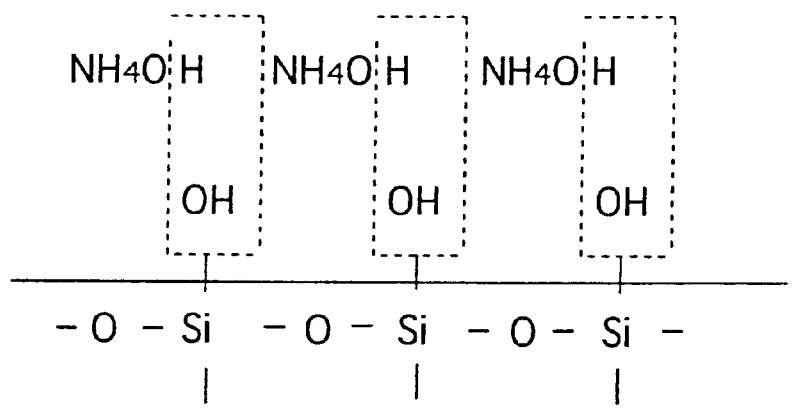
Figure 4D:
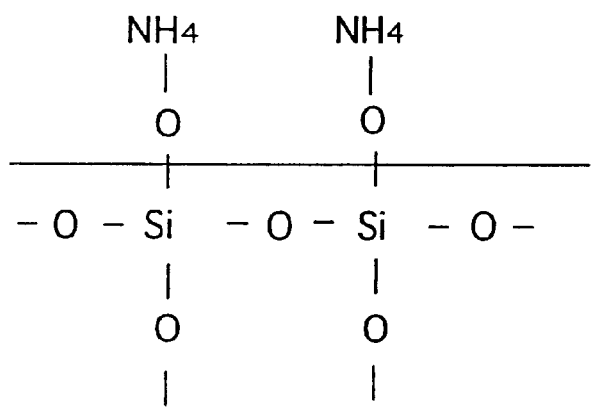
Figure 4E:
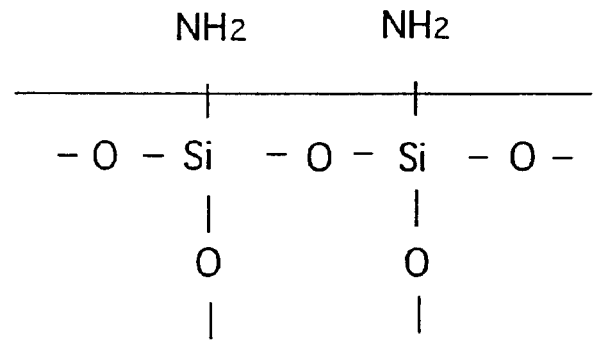

The treated surface of the $SiO_2$ film was maintained as it was after water cleaning and drying. Then, in formation of a film by the CVD method using the High $O_3$/TEOS reactant gas, the base surface dependency could be deleted completely, and the formation of the film could be performed, maintaining the same film formation rate and the same quality of the film as that in film formation on the silicon surface. Additionally, it is assumed that, $H_2O$ was furthermore removed after the surface was dried and that the structure of the surface took a form represented by the Chemical Formula 6 below. The process is shown in FIGS. 4C to 4E.

[Chemical Formula 6]

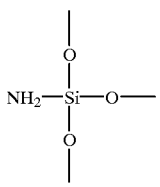

Furthermore, when the wafer in which the $SiO_2$ film is the film-forming surface of the substrate was exposed to an $NH_3$ gas, the same effect as that in the case where the wafer was exposed to ammonia water was obtained. That is, the wafer was placed in a chamber, the temperature was increased to 100° C., the $NH_3$ gas was directly fed into the chamber and the wafer was treated for one minute. Then it was found that the base surface dependency on the film-forming surface of the substrate was completely deleted from the surface of the $SiO_2$ film. In this case, it is assumed that there was the following mechanism. The OH radical on the film-forming surface of the substrate is bonded to an H of $NH_3$ and removed as $H_2O$, and instead of the OH radical, remaining $NH_2$ bonds to the dangling bond of Si in the film-forming surface of the substrate.

The modification gases that can be used in the present invention will be listed below.

(Modification Substances)

In the present invention, such compounds as ammonia ($NH_3$), hydrazine (($NH_2)_2$) and other compound having an amino radical (—$NH_2$) as their base are used as modification substances.

(a) Ammonia ($NH_3$)

Ammonia is gas at ordinary temperatures. An aqueous solution thereof is ammonia water. It should be noted that the ammonia water is called ammonium hydroxide and that the ammonia water may be referred to as $NH_4OH$ in the following description for the sake of convenience.

Furthermore, substances represented by a chemical formula $NH_nR_{4-n}$(OH) (where, n is an integer of 1 to 4 and R is an alkylene radical) can be used as the derivatives of ammonium hydroxide. For example, when n=2 and R=$CH_3$ in the above chemical formula, the substance is dimethyl ammonium hydroxide.

(b) Hydrazine (($NH_2)_2$)

Hydrazine is liquid at ordinary temperatures. (($NR_2)_2$) (where, R is any of alkylene radicals such as $CH_3$, $C_2H_5$, $C_3H_7$, aryl radicals including a benzene ring and the like) can be used a the derivatives of hydrazine. It should be noted that when R is $CH_3$, the substance is dimethyl hydrazine ($N(CH_3)_2)_2$.

(c) Amine

An amine is a compound having an organic radical (R), for example, the alkylene radical, aryl radical including the benzene ring or the like, as a substitute for an atom of hydrogen in ammonia. The amine belongs to an organic alkali.

$NR_nH_{3-n}$ (where, n is an integer of 1, 2 or 3) and the like can be used as the amines.

(d) Amino compound

An amino compound is a compound having an amino radical (—$NH_2$).

As the amino compounds, an amino acid ($RNH_2COOH$), amino benzene (aniline) ($C_6H_5NH_2$), aminophenol ($C_6H_4NH_2OH$) and aminobenzenesulfonic acid ($C_6H_4SO_3HNH_2$) and the like can be used. R is an organic radical of an alkylene radical, aryl radical including a benzene ring or the like.

These modification substances (a) to (d) have the following characteristics in common. That is, these substances have active atoms of nitrogen and the hydrophilic nature, adhere to the surface of the $SiO_2$ film and exhibit the excellent wettability. Accordingly, the modification substances used for the present invention are not limited to the examples (a) to (d) given above and any substances having the above-described characteristics can be used.

(Equipment for modification treatment/film formation apparatus)

Figure 8A:
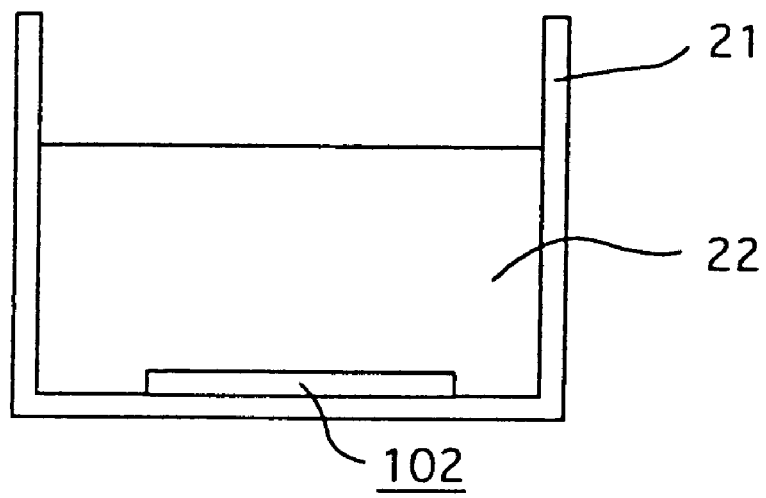
FIGS. 8A and 8B are side views showing modification treatment systems used in the method for modifying the film-forming surface of a substrate according to the embodiments of the present invention.
Figure 8B:
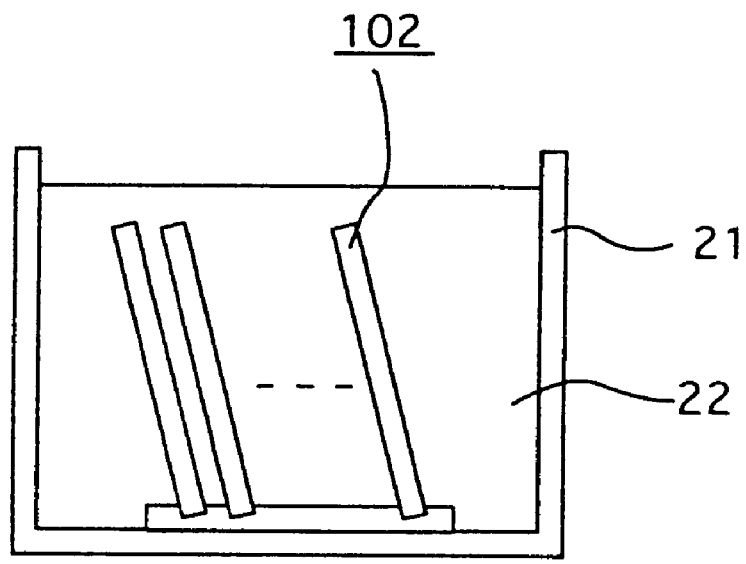

FIGS. 8A and 8B are schematic constitutions showing an apparatus for a modification treatment according to the modification method for the film-forming surface of the substrate of the embodiment of the present invention.

As is shown in FIGS. 8A and 8B, a container 21 contains a modification substance 22. The substance 22 is a liquid such as ammonia water. The film-forming substrate 102 is immersed in the liquid so as to allow the film-forming surface of the substrate 102 to be modified.

Figure 9:
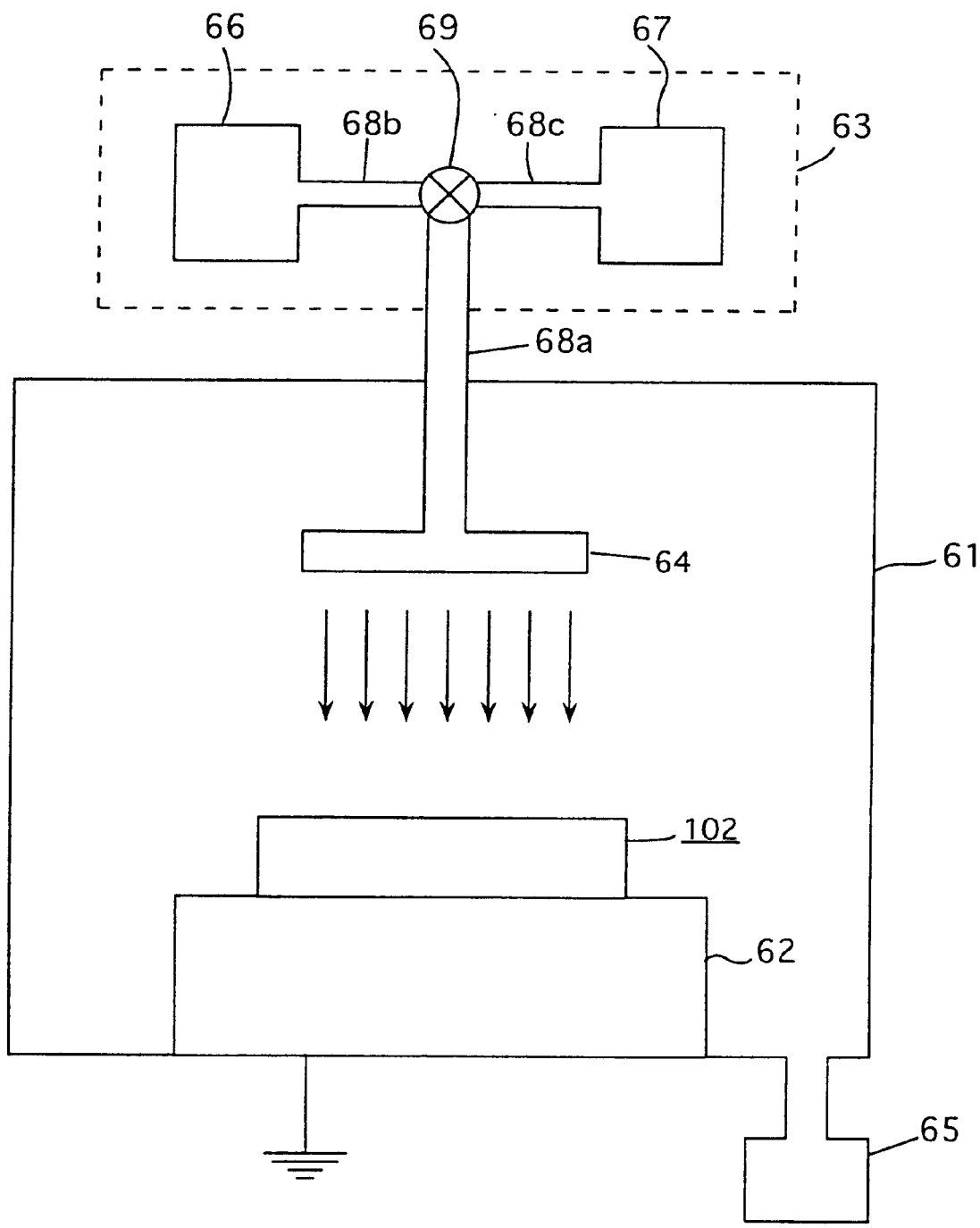
FIG. 9 is a side view showing a cold wall type modification treatment/film formation apparatus used in the method for modifying a film-forming surface of a substrate thereon according to the embodiment of the present invention.

FIG. 9 is a schematic constitution view showing a cold wall type modification treatment/CVD system. The system can perform both of the modification treatment and formation of a film by the CVD method.

A reaction chamber 61 (chamber) made of stainless is equipped with a susceptor 62 for holding a silicon wafer 102. The susceptor 62 contains a heater (heating means) for heating the silicon wafer.

The reaction chamber 61 is furthermore equipped with a pipe 68a and a gas dispersion plate 64 connected to one end of the pipe 68a. The pipe 68a introduces the gas to be used for forming a film (hereinafter referred to as deposition gas) such as a mixed $O_3$/TEOS gas or the gas to be used for modifying the film-forming surface of the base (hereinafter referred to as modification gas), the gas being supplied from gas supply means 63. The gas dispersion plate 64 applies the deposition gas or modification gas to the silicon wafer 102 placed on the susceptor 62. An air exhaustion apparatus 65 for adjusting a pressure in the reaction chamber 61 is connected to the reaction chamber 61.

The gas supply means 63 is composed of modification gas supply means 66, deposition gas supply means 67, pipes 68b and 68c and a switching valve 69 (switching means).

The modification gas supply means 66 supplies the modification gas to the inside of the reaction chamber 61 when the film-forming surface of the substrate is subjected to the modification treatment, and the deposition gas supply means 67 supplies the deposition gas after modification of the film-forming surface of the substrate.

The piper 68b and 68c are connected to these two gas supply equipment 66 and 67, respectively, and the pipes 68b and 68c are furthermore connected to the pipe 68a reaching the inside of the reaction chamber 61. The switching valve 69 is attached to a portion at which these three pipes 68b, 68c and 68a are connected together. The switching valve 69 switches channels for the gases in the manner that the switching valve 69 opens one of the channels for introducing the modification gas from the pipe 68b to the pipe 68a or the other channel for introducing the deposition gas from the pipe 68c to the pipe 68a. The modification gas and deposition gas are selectively introduced to the inside of the reaction chamber 61 through the pipe 68a by switching the channels with the switching valve 69.

In the modification gas supply means 66, the modification gas is supplied in any of the following three ways.

1) The gas is supplied as it is from a gas bomb.
2) A liquid modification substance is evaporated and then supplied as it is.
3) The evaporated modification substance is supplied in the state where it is contained in an $N_2$, $H_2$ or Ar gas as a carrier gas.

The modification gas supplied from the modification supply means 66 is introduced to the inside of the reaction chamber 61 through the pipe 68b.

In the embodiment of the present invention, although the same chamber 61 was used for the modification of the film-forming surface of the substrate as well as for formation of the $O_3$/TEOS $SiO_2$ film, separate chambers may be used.

Furthermore, either of a single wafer process chamber or a batch process system of reactor type may be used as the reaction chamber 61.

Figure 10A:
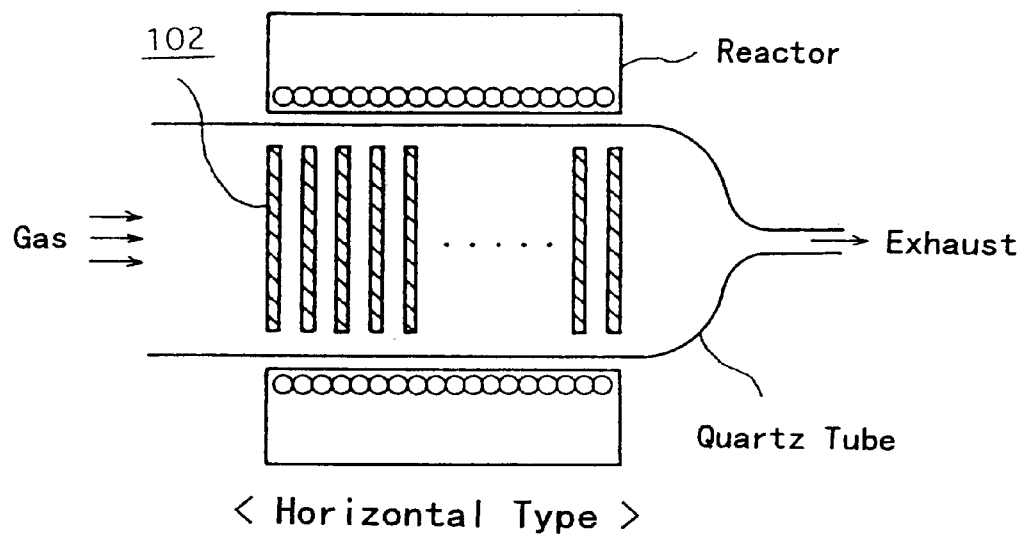
FIGS. 10A and 10B are side views, each of which shows hot wall type modification treatment/film formation apparatus used in the method for modifying the film-forming surface of the substrate according to the embodiments of the present invention.
Figure 10B:
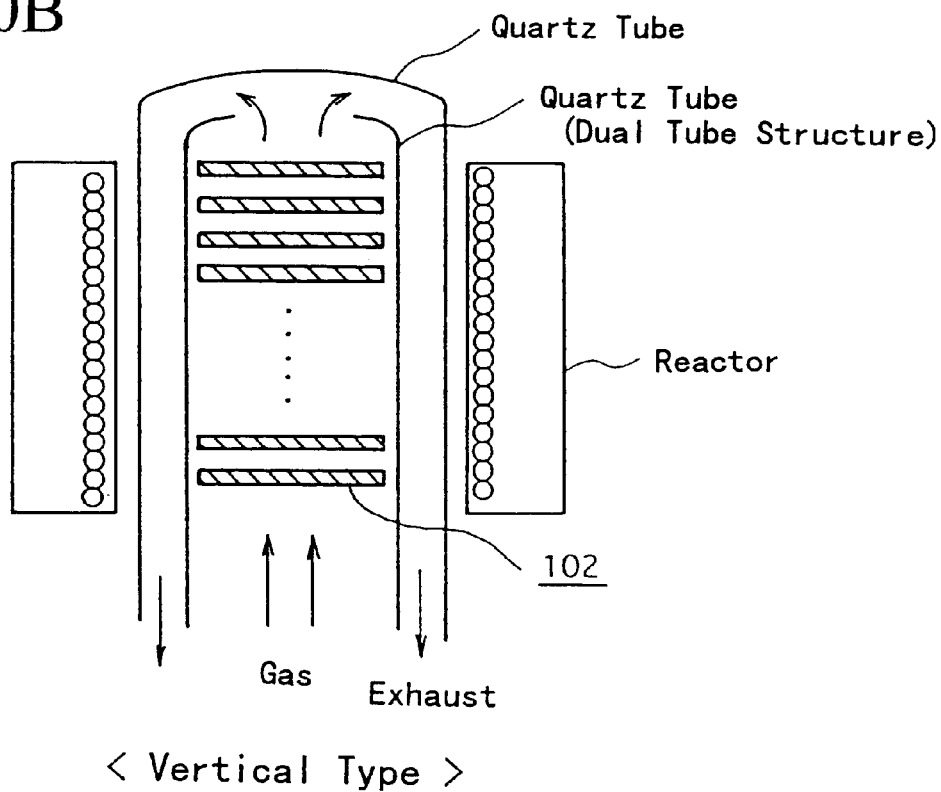

Still furthermore, in the embodiment of the present invention, a cold wall type reactor was used, however, a hot wall type reactor may be used. FIG. 10 shows the hot wall type reactors. FIG. 10A shows a horizontal type reactor and FIG. 10B shows a vertical type reactor. Either of the two types may be used.

In the case where the hot wall type reactor is used, the heater or an infrared heater placed near the chamber can be used as heating means.

(Method for modifying a film-forming surface of a substrate and method for manufacturing a semiconductor device using the same)

Next, the method for modifying the film-forming surface of the substrate and the manufacturing method for forming the semiconductor device using the same according to the present invention will be described below.

Figure 3A:
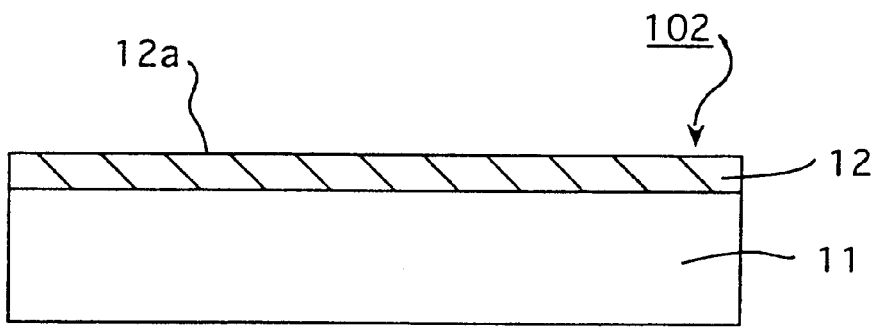
FIGS. 3A to 3C are cross-sectional views showing a method for modifying a film-forming surface of a substrate according to an embodiment of the present invention.
Figure 3B:
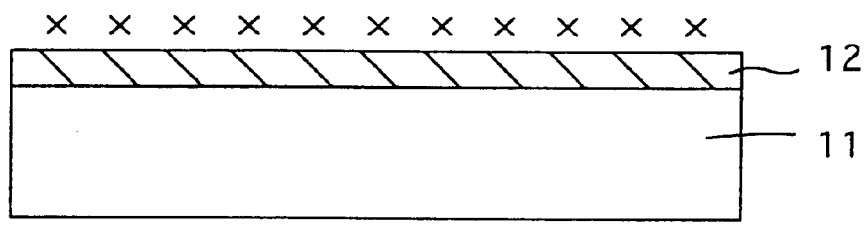
Figure 3C:
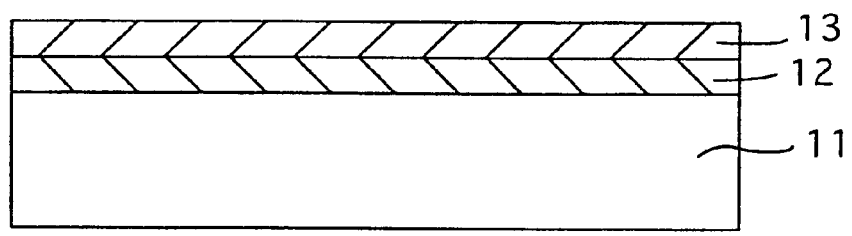

FIGS. 3A to 3C are cross-sectional view showing the method for modifying the film-forming surface of the substrate and the manufacturing method for forming the semiconductor device using the same according to the embodiments of the present invention. FIG. 4A is a cross-sectional view showing the state of a surface of a thermal oxide film 12 immediately after formation of the thermal oxide film 12 used as the film-forming surface of the substrate (i.e., the film-forming surface of the substrate 12a). The upper and lower drawings of FIG. 4B are cross-sectional views showing the state of the thermal oxide film 12 before it was modified. FIGS. 4C to 4E are drawings showing a process of the reaction between the thermal oxide film 12 and ammonia water, which was used as the modification substance, in the surface of the thermal oxide film 12. The apparatus shown in FIGS. 8A and 8B was used as the one for the modification treatment.

First, a semiconductor substrate 11 made of silicon is placed in an oxidation reactor and heated to about 1100° C. in an atmosphere of oxygen. As is shown in FIG. 3A, the surface of the semiconductor substrate 11 is oxidized, so as to form a thermal oxide film 12 made of $SiO_2$. This thermal oxide film 12 constitutes the film-forming substrate as the uppermost layer, that is, the surface of the film 12 is now the film-forming surface 12a of the substrate. Thus, the film-forming substrate 102 is composed of the semiconductor substrate 11 and the thermal oxide film 12. It should be noted that wirings may be formed on the thermal oxide film 12. In this case, the film-forming substrate 102 includes the wirings.

It should be also noted that the step of forming the above base later, which is the thermal oxide film 12, may be performed by a plasma CVD method, a reduced pressure CVD method or the like.

It is assumed that, as shown in FIG. 4A, the dangling bond of Si exists in the surface of the thermal oxide film 12 immediately after formation thereof. However, it is assumed that, as is shown in the upper drawing of FIG. 4B, the surface of the thermal oxide film 12 is normally in the state of hydration by contacting with water-laden air where an Si—OH bond is created. Alternatively, as is shown in the lower drawing of FIG. 4B, the surface of the thermal oxide film 12 may be in the state where an Si—$H_2O$ bond is created. Whichever state it may be, it is assumed that the surface of the thermal oxide film 12 has the hydrophilic nature (hydrophilicity).

Next, as is shown in FIGS. 8A and 8B, the film-forming substrate 102 is immersed in ammonia water (i.e. the modification substance) 22. It can be assumed that the reaction described below is taking place between the thermal oxide film 12 and ammonia water 22 while the film-forming substrate 102 is in the ammonia water.

The reaction will now be described, taking the case where the dangling bond of Si is terminated in —OH in the surface of the thermal oxide film 12.

First, the surface of the heated thermal oxide film 12 is exposed to $NH_4OH$. In the surface of the heated thermal oxide film 12, as is shown in FIG. 4C, —OH of the Si—OH bond and —H in $NH_4OH$ are bonded together, so as to generate $H_2O$. With this reaction, —H is removed from $NH_4OH$, so as to leave $NH_4O$ on the bond of Si in the surface of the thermal oxide film 12. The resultant $H_2O$ is released from the reactive region on the surface of the thermal oxide film 12.

Next, the film-forming surface 12a of the substrate 102 is dried by heating or other means. As is shown in FIG. 4E, $H_2O$ is removed from $NH_4O$ bonded to Si in the surface of the thermal oxide film 12, so as to leave $NH_2$. As a result, the surface of the thermal oxide film 12 shows the hydrophobic nature (hydrophobicity).

In the case where Si in the surface of the thermal oxide film 12 is bonded to $H_2O$, it is assumed that the surface of the thermal oxide film 12 exhibits the hydrophobic nature by way of the following step. The reaction takes place between $NH_4OH$ and $H_2O$, followed by the similar process to that in the case where the Si—OH bond exists in the surface of the thermal oxide film 12. $H_2O$ bonded to Si in the surface of the thermal oxide film 12 is substituted by $NH_2$—.

Subsequent to the above-described modification treatment, the supply of the modification gas is stopped, and the High $O_3$/TEOS gas, as the deposition gas for use in film formation, is fed from the deposition gas supply means 67 into the reaction chamber 61.

Then, the film-forming substrate 102 is heated to 400° C. to cause a thermal reaction between $O_3$ and TEOS. The reactive state is maintained for a predetermine time. After the passage of the predetermined time, as is shown in FIG. 3C, a High $O_3$/TEOS CVD $SiO_2$ film is formed on the thermal oxide film 12.

In the case where the system as shown in FIG. 9 which is used for both of the modification treatment and film formation, the steps of the modification treatment and film formation are performed as the following.

First, the thermal oxide film 12 is formed in the same manner as described above. Here, an assumption is made that the state of the film-forming surface 12a of the substrate 102 is the same as that shown in the upper or lower drawing of FIG. 4B.

Next, as is shown in FIG. 9, the silicon wafer 1 is placed on the susceptor 62 in the reaction chamber 61, and is heated to at least 100° C. by the heater built-in in the susceptor 62. Then, the $NH_3$ gas (i.e. the modification gas) is supplied from the modification gas supply means 66 to the reaction chamber 61. The modification gas is applied to the surface of the thermal oxide film 12 formed on the semiconductor substrate 11.

It can be assumed that the reaction similar to that shown in FIGS. 4C to 4E is taking place between the thermal oxide film 12 and the modification gas on the surface of the thermal oxide film 12 while the gas is being applied. In other words, it can be assumed that there is a reactive mechanism. That is, an OH radical in the film-forming surface 12a of the substrate 102 is bonded to H of $NH_3$, so as to be removed as $H_2O$, and remaining $NH_2$ substitutes for the OH radical, so that $NH_2$ is bonded to the dangling bond of Si in the film-forming surface 12a of the substrate 102.

Since the modification gas containing the active nitrogen is used in the above-described modification treatment performed on the film-forming surface 12a of the substrate 102, it is possible to move immediately to the next step, which is the step of forming a film, without performing any treatment, such as cleaning and the like, on the surface of the thermal oxide film 12 after the above-described modification treatment. That is, subsequent to the above-described modification treatment, the supply of the modification gas is stopped and the mixed $O_3$/TEOS gas, as the deposition gas, is fed from the deposition gas supply means 67 to the inside of the reaction chamber 61.

Then, under the same conditions as described above, the High $O_3$/TEOS CVD $SiO_2$ film 13 is formed on the film-forming substrate 102.

Thus, in the present invention, since film formation is performed using $O_3$/TEOS reactant gas after modifying the surface of the thermal oxide film 12 into hydrophobicity, the fluidity, flatness, concavity embedment and step coverage exhibited by the formed High $O_3$/TEOS CVD $SiO_2$ film 13 can be enhanced.

In particular, since the modification gas containing the active element of nitrogen is used as the modification gas, the effects of modification can be maintained. In fact, the High $O_3$/TEOS CVD $SiO_2$ film 13 was formed on the surface of the thermal oxide film 12 after exposing the surface of the thermal oxide film 12 to air for 24 hours after modifying the film-forming surface 12a of the substrate 102. The fluidity, flatness, concavity embedment and step coverage exhibited by the formed High $O_3$/TEOS CVD $SiO_2$ film 13 were still maintained.

(First Embodiment)

Now, the first embodiment will be described with reference to FIG. 5. In this embodiment, the modification method of the present invention is applied to the film-forming surface of the substrate 102 in which the wirings 14a and 14b made of aluminum or the like are formed on the thermal oxide film 12.

Figure 5:
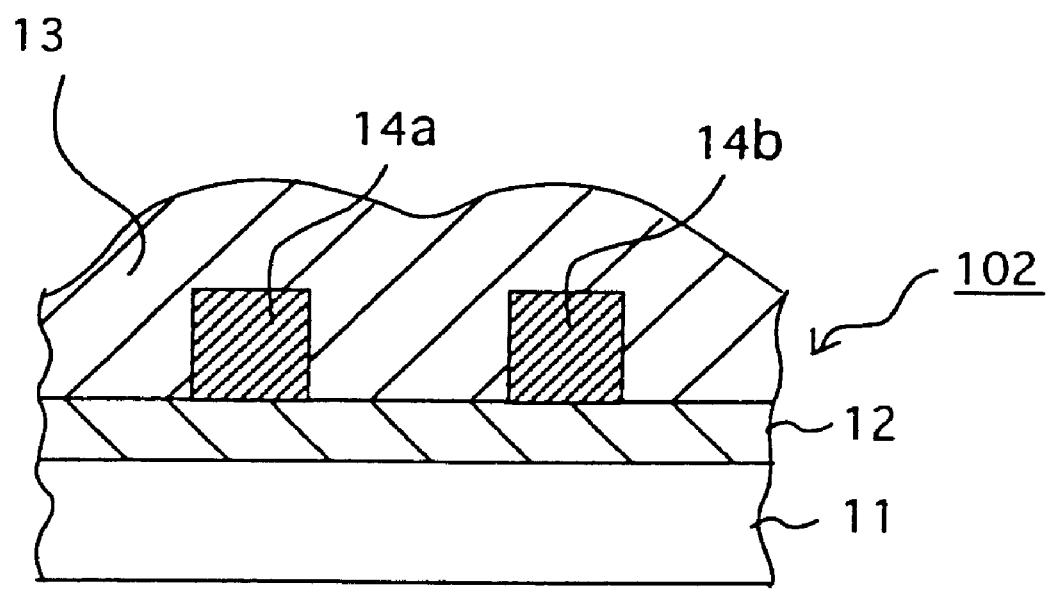
FIG. 5 is a cross-sectional view showing a first embodiment of the embodiment, in which the method for modifying the film-forming surface of the substrate of the present invention is applied to a film-forming surface of a substrate which has wirings.

In FIG. 5, the same elements as the elements shown in FIG. 3 are denoted by the same reference numerals.

As is shown in FIG. 5, the semiconductor substrate 11 made of silicon was heated to 1100° C., so as to form the thermal oxide film 12 made of $SiO_2$ having thickness of about 300 nm on the surface thereof. The thermal oxide film 12 was thus prepared to be used as the base layer on which another film is to be formed.

Next, the film-forming surface of the substrate 102 was modified by exposing the film-forming surface of the substrate 102 to the modification gas. As one of the conditions for modifying the surface of the base, the $NH_3$ gas (modification gas) was used. The $NH_3$ gas was allowed to contact with the film-forming surface of the substrate 102.

Next, the High $O_3$/TEOS CVD $SiO_2$ film 13 of about 500 nm in thickness was formed on the modified surface of the base layer 12. As one of the conditions for forming the High $O_3$/TEOS CVD $SiO_2$ film 13, the concentration of ozone contained in the deposition gas, which was consisted of the mix $O_3$/TEOS gas, was set at "a high concentration", that is, 5% of $O_3$ in $O_2$. The film-forming substrate 102 was heated to 400° C.

As shown in FIG. 5, the modification treatment using the method for modifying the film-forming surface of the base according to the first embodiment was performed, and then the High $O_3$/TEOS CVD $SiO_2$ film 13 having the smooth surface free from voids was formed by the CVD method using the High $O_3$/TEOS deposition gas.

As described above, when the surface modification for the uneven film-forming surface 12a of the substrate 102 having wirings 14a and 14b or the like was performed by using the modification gas containing the active element of nitrogen, the High $O_3$/TEOS CVD $SiO_2$ film 13 can be formed so as to completely fill the concave portion between the wirings 14a and 14b and so as to give the excellent step coverage at the steps of the wirings 14a and 14b.

(Second Embodiment)

Now, the second embodiment will be described with reference to FIG. 6.

Figure 7:
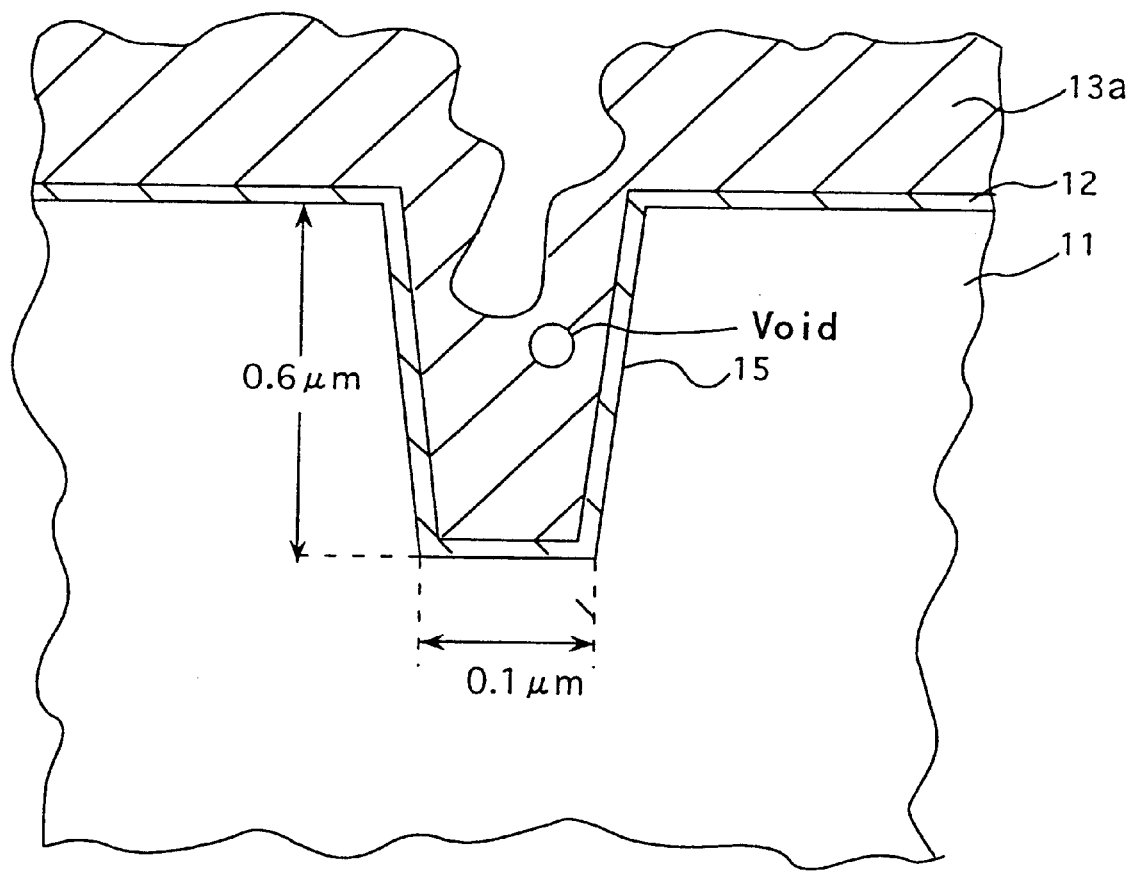
FIG. 7 is a cross-sectional view showing a comparative example of FIG. 6.

In this embodiment, the present invention is applied to the film-forming surface of the substrate having the narrow and deep trench therein. For comparison, a comparative example is shown in FIG. 7, in which a film was formed on the "base layer" which had not been subjected to the modification method of the present invention.

Figure 6:
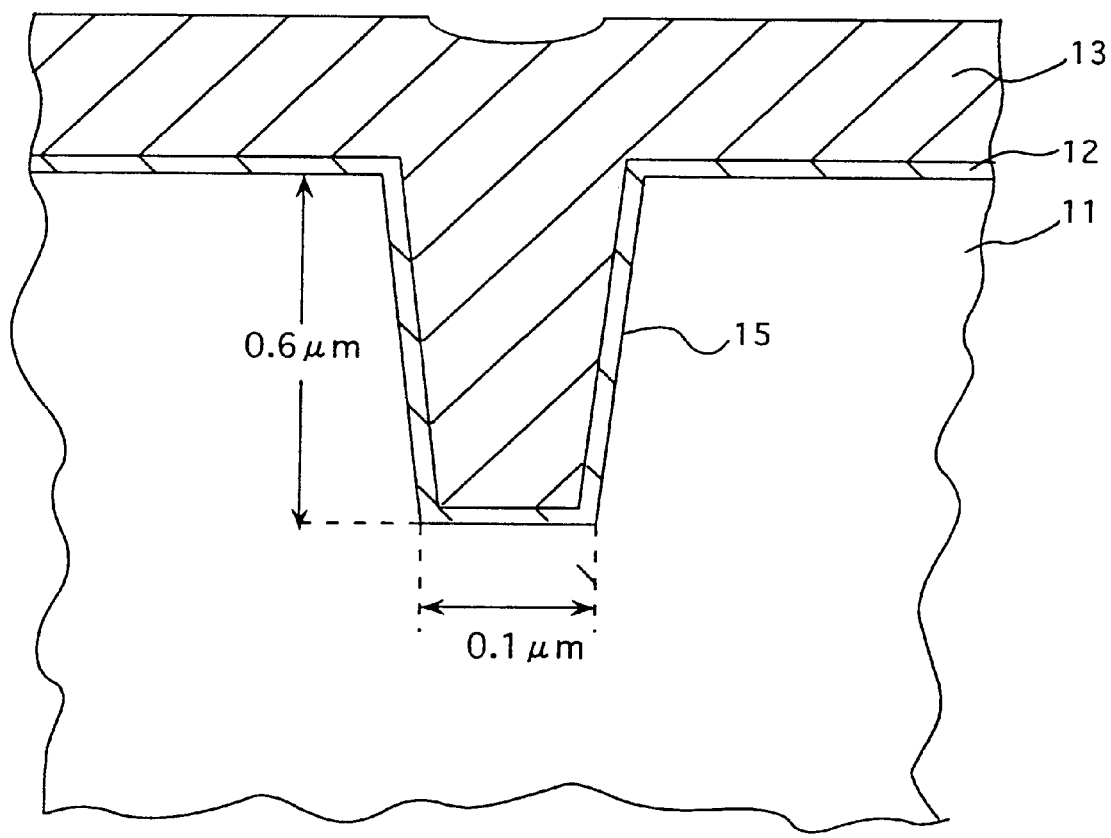
FIG. 6 is a cross-sectional view showing a second embodiment of the present invention, in which the method for modifying the film-forming surface of the substrate is applied to a film-forming surface of a substrate having a trench.

FIG. 6 is a drawing showing a cross-sectional view of the High $O_3$/TEOS CVD $SiO_2$ film 13 formed after performing the modification treatment on the film-forming surface of the substrate. FIG. 7 is a drawing showing a cross-sectional view of a High $O_3$/TEOS CVD $SiO_2$ film 13a formed without performing the modification treatment. In FIGS. 6 and 7, the same elements as the elements shown in FIG. 3 are denoted by the same reference numerals.

As is shown in FIG. 6, the trench of about 0.1 $\mu$m in width and about 0.6 $\mu$m in depth was formed in the surface of the semiconductor substrate 11 made of silicon. The thermal oxide film 12 made of $SiO_2$ was formed on the surface of the semiconductor substrate 11 under the same conditions as in the first embodiment. The thermal oxide film 12 is thus prepared as the base layer. Then, the High $O_3$/TEOS CVD $SiO_2$ film 13 was formed on the surface of the base layer. Then, the concavity embedment and step coverage exhibited by the High $O_3$/TEOS CVD $SiO_2$ film 13 was examined.

Unlike the first embodiment, ammonia water was used as the modification substance. The film-forming substrate 102 was immersed therein. The temperature of the ammonia water was set in a range 50 to 80° C. and a time for immersion was set at about 10 minutes.

As a part of the conditions for forming the $O_3$/TEOS CVD $SiO_2$ film 13, the concentration of ozone and the heating temperature for the film-forming substrate 102 were set at the same value as in the first embodiment.

From FIG. 6, it can be seen that the $O_3$/TEOS CVD $SiO_2$ film 13 having the flat surface was formed on the sample, which had been subjected to the modification treatment using the method for modifying the surface of the film on which another film is to be formed according to the embodiment of the present invention.

In contrast to the above, from FIG. 7, it can be seen that, when the $O_3$/TEOS CVD $SiO_2$ film 13 was formed without performing the modification treatment on the surface of the base, the surface of the film 13 was not flat but wavy with a void therein.

As described above, in the case where the surface of the base layer 12 having a very narrow trench 15 is modified by using the modification gas containing active nitrogen, the embedment and step coverage of the trench 15 by the High $O_3$/TEOS CVD $SiO_2$ film 13 can be enhanced.

It should be noted that the High $O_3$/TEOS CVD $SiO_2$ film 13 is used as the insulating film to be formed on the film-forming surface 12a in the above embodiments, however, the insulating films formed by combination of other silicon-containing organic compounds, for example, alkoxysilane, siloxane and the like, and oxidation gases may be used.

Furthermore, as the insulating film to be formed on the film forming surface 12a, any of PSG (Phosphosilicate glass) film, a BSG (Borosilicate glass) film and BPSG (Borophosphosilicate glass) film may be used other than the $SiO_2$ film. For the deposition gas used to form the PSG film, a mixed $O_3$-TEOS-TMP (Trimethylphosphite: $P(OCH_3)_3$) gas or a mixed $O_3$-TEOS-TMOP (Trimethylphosphate: $PO(OCH_3)_3$) gas may be used. For the deposition gas used to form the BSG film, a mixed $O_3$-TEOS-TMB (Trimethylborate: $B(OCH_3)_3$) gas may be used. For the deposition gas used to form the BPSG film, a mixed $O_3$-TEOS-TMB-TMP gas or a mixed $O_3$-TEOS-TMB-TMOP gas may be used.

Furthermore, in the above embodiments, the modification treatment is performed using the liquid or gas without adding acceleration, however, application of ultrasonic and/or megasonic to the substrate 102 during the modification treatment may further enhance the effects of modification.

As described above, according to the modification method of the present invention, since the film-forming surface of the substrate on which the insulating is to be formed has been modified by allowing ammonia, hydrazine, the amine, the amino compounds, gaseous derivatives thereof or liquids thereof to contact with the film-forming surface of the substrate before formation of the film, the dangling bond of silicon in the film-forming surface of the base can be terminated in $NH_4O$— or $NH_2$—.

Therefore, the surface dependency on the base in formation of the film thereon can be deleted.

In particular, since the neutral gas is used as the modification substance, the modification substance covers the surface of the narrow and deep concavity and the surface dependency on the surface of the concavity can be deleted.

Accordingly, in the case where the film is formed, by the thermal CVD method, on the film-forming surface of the base the surface dependency has been deleted on the surface thereon, the interlayer insulating film and/or cover insulating film, which are excellent in quality and free of rough surfaces and voids, can be formed without bringing about reduction of film deposition rate. It is also possible to fill almost completely the narrow and deep concavity. Microni-zation and high integration of the semiconductor device can be therefore realized.

Although the preferred embodiment of the present invention has been described in detail, it should be understood that various changes, substitutions and alternations can be made therein without departing from the spirit and cope of the invention as defined by the appended claims.

What is claimed is:

1. A method for modifying a film-forming surface of a substrate comprising:

contacting said film-forming surface of the substrate with at least one agent, in aqueous solution or as an electrically neutral gas, selected from the group consisting of ammonia and hydrazine, before forming an insulating film on said film-forming surface of the substrate.

2. The method according to claim 1, wherein said film-forming surface is a surface presenting, exposed thereon, at least one of a silicon oxide film and a silicon nitride film.

3. The method according to claim 2, wherein said film-forming surface of the substrate has exposed thereon at least one of a semiconductor and wirings in addition to at least one of said silicon oxide film and said silicon nitride film.

4. The method according to claim 2, wherein said surface has a silicon oxide film formed by the thermal oxidation method, thermal CVD method or plasma enhanced CVD method.

5. The method according to claim 2, wherein said surface has a silicon nitride film formed by the thermal CVD method or plasma enhanced CVD method.

6. A method for manufacturing a semiconductor device comprising:

modifying a film-forming surface of a substrate by contacting the surface with at least one agent, in aqueous solution or as an electrically neutral gas, selected from the group consisting of ammonia and hydrazine; and forming an insulating film on the modified film-forming surface of the substrate.

7. The method according to claim 6, wherein said insulating film is a silicon-containing insulating film formed by a thermal CVD method using a reactant gas containing an ozone-containing gas and Tetra-Ethyl-Ortho-Silicate.

8. The method according to claim 1 wherein said agent is an electrically neutral gas supplied as is from a gas bomb.

9. The method according to claim 1 wherein said agent is an electrically neutral gas formed by evaporation from liquid phase and contacted, as evaporated, with said surface.

10. The method according to claim 1 wherein said agent is an electrically neutral gas formed by evaporation from liquid phase, mixed with a carrier gas and then contacted with said surface.

11. The method according to claim 6 wherein said agent is an electrically neutral gas supplied as is from a gas bomb.

12. The method according to claim 6 wherein said agent is an electrically neutral gas formed by evaporation from liquid phase and contacted, as evaporated, with said surface.

13. The method according to claim 6 wherein aid agent is an electrically neutral gas formed by evaporation from liquid phase, mixed with a carrier gas and then contacted with said surface.

* * * * *

UNITED STATES PATENT AND TRADEMARK OFFICE
CERTIFICATE OF CORRECTION

PATENT NO. : 6,255,230 B1
DATED : July 3, 2001
INVENTOR(S) : Ikakura et al.

It is certified that error appears in the above-identified patent and that said Letters Patent is hereby corrected as shown below:

Column 2,
Line 20, after "before" insert -- forming --
Line 39, "enhances" should read -- enhanced --

Figure 2A:
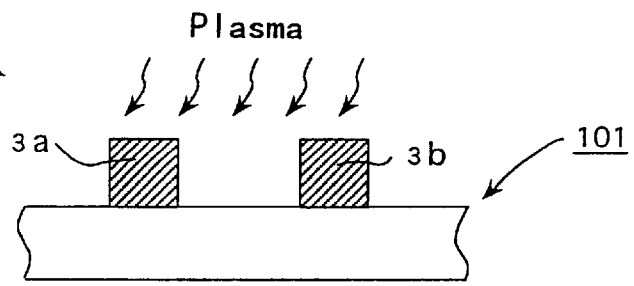
FIGS. 2 to 2D are cross-sectional views, each of which shows a conventional method for modifying a film-forming surface of a substrate.
Figure 2B:
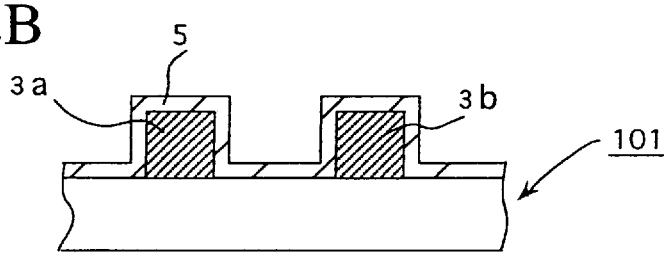
Figure 2C:
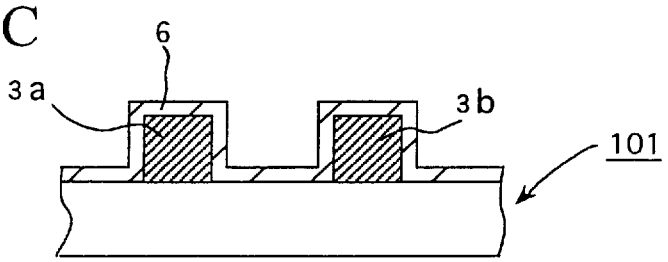
Figure 2D:
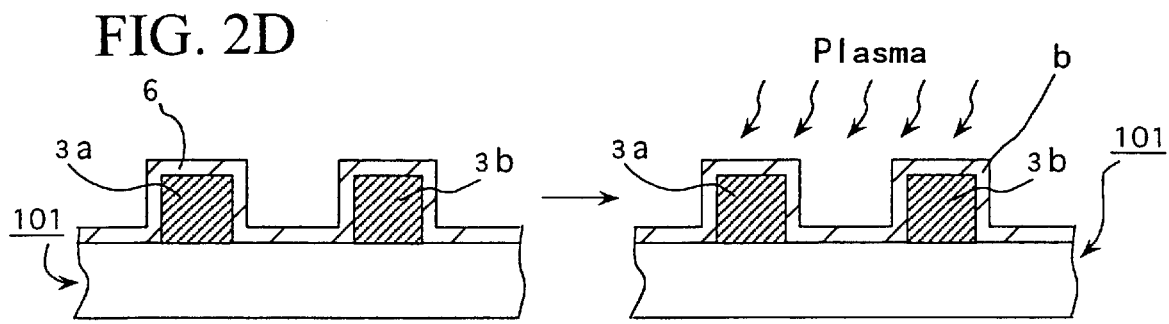

Column 4,
Line 7, "FIGS. 2" should read -- FIGS. 2A --
Line 19, "embodiment" should read -- present invention --

Column 8,
Line 60, "piper" should read -- pipes --

Column 14,
Line 6, "cope" should read -- scope --

Signed and Sealed this

Seventeenth Day of September, 2002

Attest:

JAMES E. ROGAN
Attesting Officer    Director of the United States Patent and Trademark Office